United States Patent
Tsai et al.

(10) Patent No.: US 6,410,106 B2
(45) Date of Patent: *Jun. 25, 2002

(54) METHOD OF FORMING AN INTERMETAL DIELECTRIC LAYER

(75) Inventors: Cheng-Yuan Tsai, Yunlin Hsien; Chih-Chien Liu, Taipei; Ming-Sheng Yang, Hsinchu, all of (TW)

(73) Assignee: United Microelectronics Crop., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/759,570

(22) Filed: Jan. 11, 2001

Related U.S. Application Data

(63) Continuation of application No. 09/471,055, filed on Dec. 22, 1999, now Pat. No. 6,200,653.

(51) Int. Cl.[7] .................................................. H05H 1/24
(52) U.S. Cl. ...................... 427/579; 427/574; 427/578; 427/255.37; 438/424; 438/702; 438/763; 438/784
(58) Field of Search ................................ 427/579, 574, 427/578, 255.37; 438/424, 702, 763, 784

(56) References Cited

U.S. PATENT DOCUMENTS

| | | | | |
|---|---|---|---|---|
| 5,937,323 A | * | 8/1999 | Orczyk et al. | ............... 438/624 |
| 5,968,610 A | * | 10/1999 | Liu et al. | .................... 427/579 |
| 6,200,653 B1 | * | 3/2001 | Tsai et al. | ................... 427/579 |

* cited by examiner

*Primary Examiner*—Brian K. Talbot

(57) ABSTRACT

A method is used to form an intermetal dielectric layer. According to the invention, an unbiased-unclamped fluorinated silicate glass layer used as a protection layer is formed by high density plasma chemical vapor deposition on a biased-clamped fluorinated silicate glass layer formed by high density plasma chemical vapor deposition to prevent the biased-clamped fluorinated silicate glass layer from being exposed in a planarization process.

4 Claims, 3 Drawing Sheets

METHOD OF FORMING AN INTERMETAL DIELECTRIC LAYER

CROSS REFERENCE TO RELATED APPLICATION

The present application is a continuation of U.S. patent application Ser. No. 09/471,055, filed Dec. 22, 1999 now U.S. Pat. No. 6,200,653.

BACKGROUND OF THE INVENTION

1. Field of the Invention

The invention relates to a method for forming an integrated circuit, and more particularly, to a method for forming an intermetal dielectric layer with multilevel interconnects.

2. Description of the Related Art

In an integrated circuit with two or more levels of interconnects, an intermetal dielectric layer must be placed between the levels for isolation. Generally, the intermetal dielectric layer must have characteristics such as good reliability, good mechanical stability, good compatibility, low water absorption capability, etc.

A typical material for the intermetal dielectric layer is silicon oxide that has a dielectric constant of about 4. However, since a device having a higher operation speed requires a material having a lower dielectric constant as the intermetal dielectric layer, fluorinated silicon glass (FSG) having a dielectric constant of about 3.5 is replacing the silicon oxide as the intermetal dielectric layer.

According to the prior art, the method to form the intermetal dielectric layer is as follows. A plurality of metal conductive lines is formed on a substrate. The plurality of metal conductive lines is distributed in two regions, respectively, a tied conductive line region (i.e. a dense line region) having a higher distribution density and a loose conductive line region (i.e. a iso line region) having a lower distribution density. A biased-clamped FSG layer is formed on the substrate by high density plasma chemical vapor deposition (HDPCVD), and fills gaps between metal lines. Before the biased-clamped FSG layer is formed, the process further comprises forming a silicon glass liner layer by HDPCVD. The silicon glass liner layer is used to prevent the metal lines from being attacked by fluorine. Then, an oxide layer is formed as a cap layer on the biased-clamped FSG layer by plasma enhanced chemical vapor deposition (PECVD). A chemical mechanical polishing process is subsequently performed on the oxide layer.

Due to different distribution densities, the spacing between conductive lines in different regions (the tied conductive line region and the loose conductive line region) is different. This may result in a large step height difference between the tied conductive line region and the loose conductive line region after the biased-clamped FSG layer and the cap layer are formed. Thus, the polishing stop for chemical mechanical polishing is difficult to control, and over-polishing easily arises. As a result, the biased-clamped FSG layer may be exposed. Since the amount of fluorine in the biased-clamped FSG layer is difficult to control, and the biased-clamped FSG layer exhibits intrinsically hydrophilic behavior, the biased-clamped FSG layer easily absorbs water when the biased-clamped FSG layer contacts is in contact with an aqueous base slurry during chemical mechanical polishing process. Thus, the reaction product produced during chemical mechanical polishing process can result in metal corrosion, oxide degradation peeling at the metal/intermetal dielectric layer interface, and an increased dielectric constant. Furthermore, when a metal plug is formed, the HF can poison the metal plug, the contact resistance is increased and the increased contact resistance can affect the subsequent process.

SUMMARY OF THE INVENTION

According to above, the invention provides a method for forming an improved intermetal dielectric layer. In order to prevent the biased-clamped FSG layer from being exposed the method provides an unbiased-unclamped FSG layer as a protect layer on the biased-clamped FSG layer.

The method comprises the following steps. A plurality of metal lines is formed on a substrate. A biased-clamped FSG layer is formed on the substrate by HDPCVD. An unbiased-unclamped FSG layer as a protection layer is formed on the biased-clamped FSG layer by HDPCVD. An oxide layer as a cap layer is formed on the protection layer. A planarization process is performed on the oxide layer.

The unbiased-unclamped FSG layer is used as a protection layer in the invention to prevent the biased-clamped FSG layer from being exposed during a planarization process and attacked by water.

It is to be understood that both the foregoing general description and the following detailed description are exemplary, and are intended to provide further explanation of the invention as claimed.

DESCRIPTION OF THE PREFERRED EMBODIMENTS

Figure 1A:
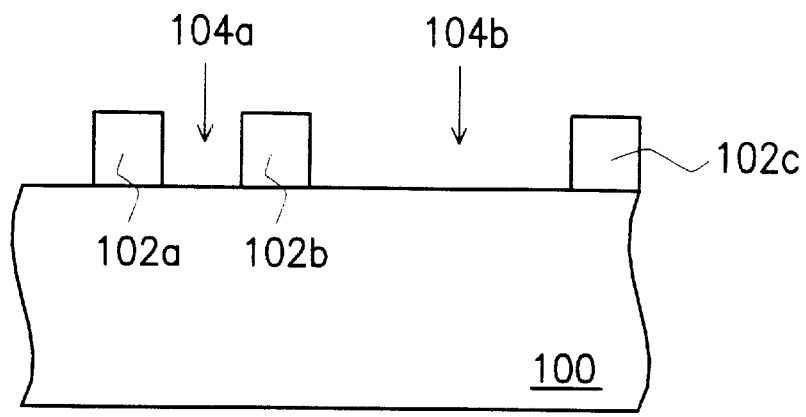
FIG. 1A through FIG. 1C are schematic, cross-sectional views showing a process for forming an intermetal dielectric layer according to a first preferred embodiment of the invention.
Figure 1B:
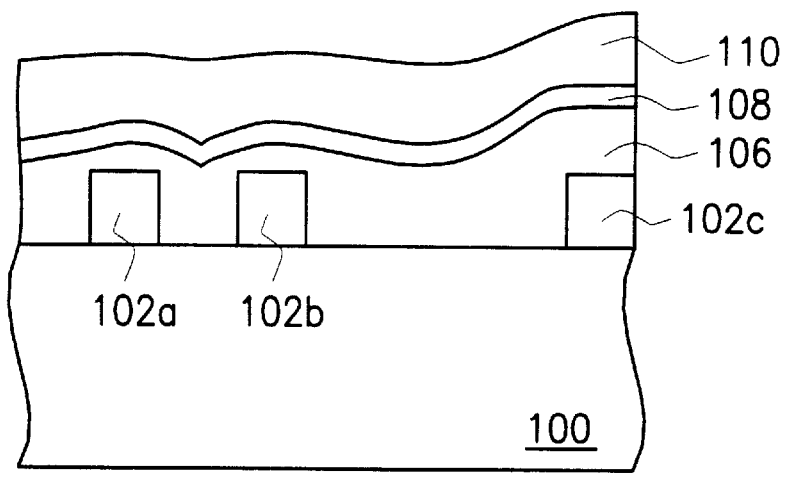
Figure 1C:
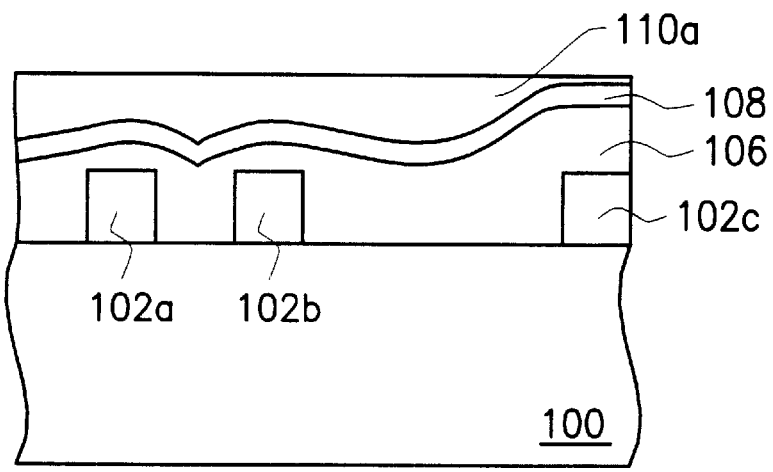

FIG. 1A through FIG. 1C are schematic, cross-sectional views showing a process for forming an intermetal dielectric layer according to a first preferred embodiment of the invention.

Referring to FIG. 1A, a substrate 100 is provided. A plurality of metal conductive lines 102a, 102b, and 102c is formed on the substrate 100. A tied conductive line region 104a and a loose conductive line region 104b consist of the plurality of metal conductive lines 102a, 102b, and 102c.

Referring to FIG. 1B, a dielectric layer 106 is formed on the substrate 100. Due to different spacings among the metal conductive lines 102a, 102b, and 102c, the height of the dielectric layer 106 is not uniform. The dielectric layer 106 comprises biased-clamped fluorinated silicon glass (FSG) formed by, for example, high density plasma chemical vapor deposition (HDPCVD). The dielectric constant of the biased-clamped FSG is about 3.5, which depends on the process variation. The FSG is widely used as an intermetal dielectric material because of its low dielectric constant, capability of decreasing capacitance between interconnects, and good gap-filling capability.

In addition, before forming the dielectric layer 106, an undoped silicon glass liner layer can be formed on the substrate 100 by, for example, HDPCVD. Since the undoped silicate glass liner layer has good compatibility with the FSG layer, the undoped silicate glass liner layer can promote adhesion between the FSG layer and another material layer and benefit the subsequent process.

Although the dielectric constant of the undoped silicon glass liner layer is about 4.1, it is very thin; thus, the undoped silicon glass liner layer does not affect the overall dielectric constant of the intermetal dielectric layer.

A protection layer 108 is formed on the dielectric layer 106. The protection layer 108 comprises unbiased-unclamped FSG formed by, for example, HDPCVD. The dielectric constant of the unbiased-unclamped FSG is about 3.5, which thickness depends on the process. "Unbiased" means that no bias is applied during performing the HDPCVD, and "unclamped" means that there is no helium cooling device on the backside of the substrate 100 during the deposition, or that no helium cooling process is performed on the substrate 100 during the deposition.

Since the depositing rate of the unbiased-unclamped FSG layer (the protection layer 108) formed by HDPCVD is greater than that of the biased-clamped FSG layer (the dielectric layer 106) formed by HDPCVD, the throughout is not affected by the process of first forming the dielectric layer 106 to a thinner thickness than in the prior art and then forming the protection layer 108 to an adequate thickness.

Since the dielectric constant of the protection layer 108 is nearly the same as that of the dielectric layer 106, the protection layer 108 does not affect the overall dielectric constant of the intermetal dielectric layer.

A cap layer 110 is formed on the protection layer 108. The cap layer 110 is, for example, an oxide layer formed by HDPCVD or by PECVD. Referring to FIG. 1C, a planarization process such as chemical mechanical polishing (CMP) is performed on the cap layer 110.

Since the unbiased-unclamped FSG layer has a lower water absorption capability than the conventional FSG layer, if the unbiased-unclamped FSG layer is exposed due to the chemical mechanical polishing process, the unbiased-unclamped FSG layer does not react with an aqueous slurry or water to produce hydrogen fluoride (HF). Thus, the protection layer 108 can prevent the dielectric layer 106 from being over-etched as occurred in the prior art.

Figure 2:
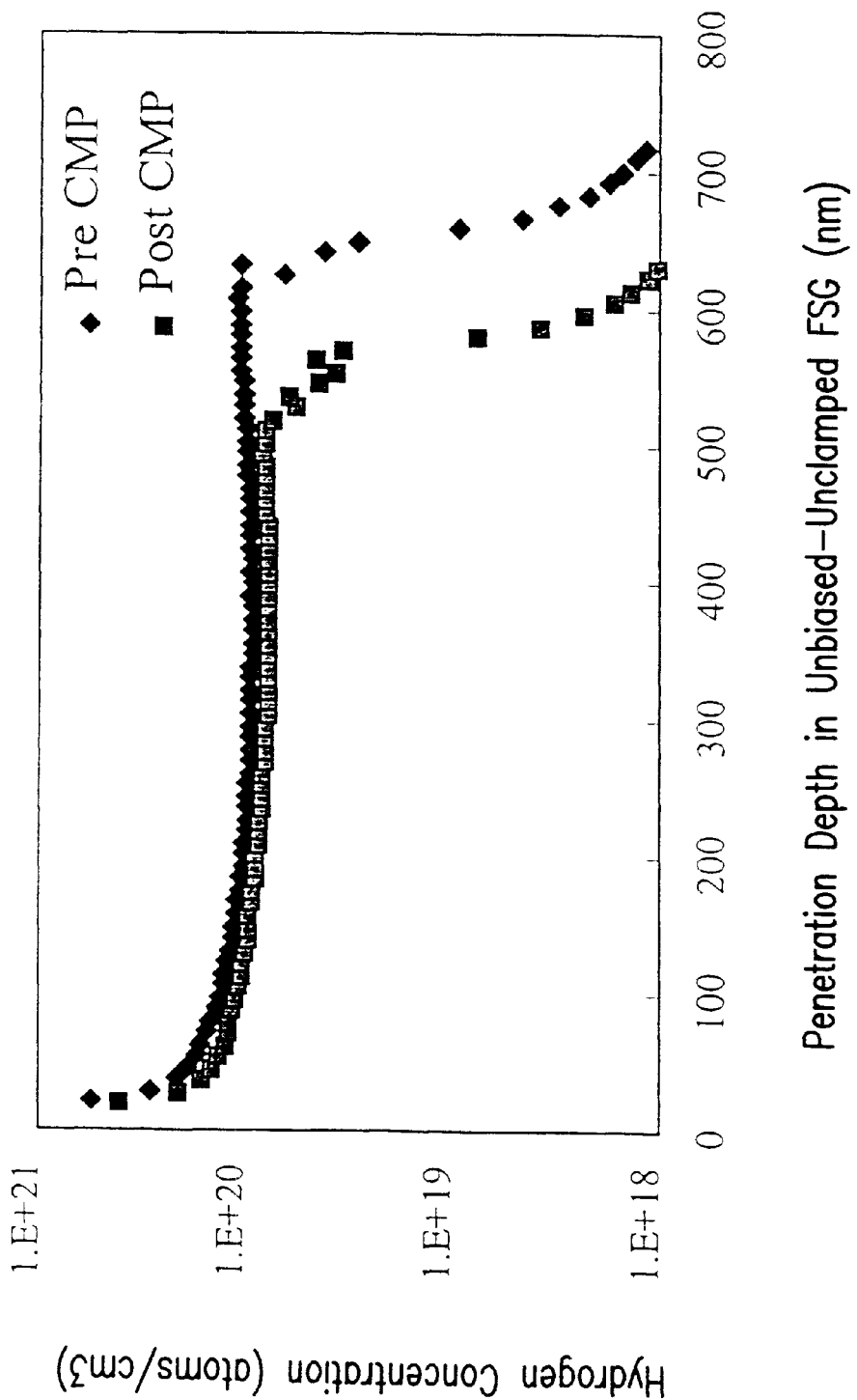
FIG. 2 shows the relationship between the penetration depth (nm) in the unbiased-unclamped FSG layer and hydrogen concentration using Secondary Ion Mass Spectroscopy (SIMS)
Figure 3:
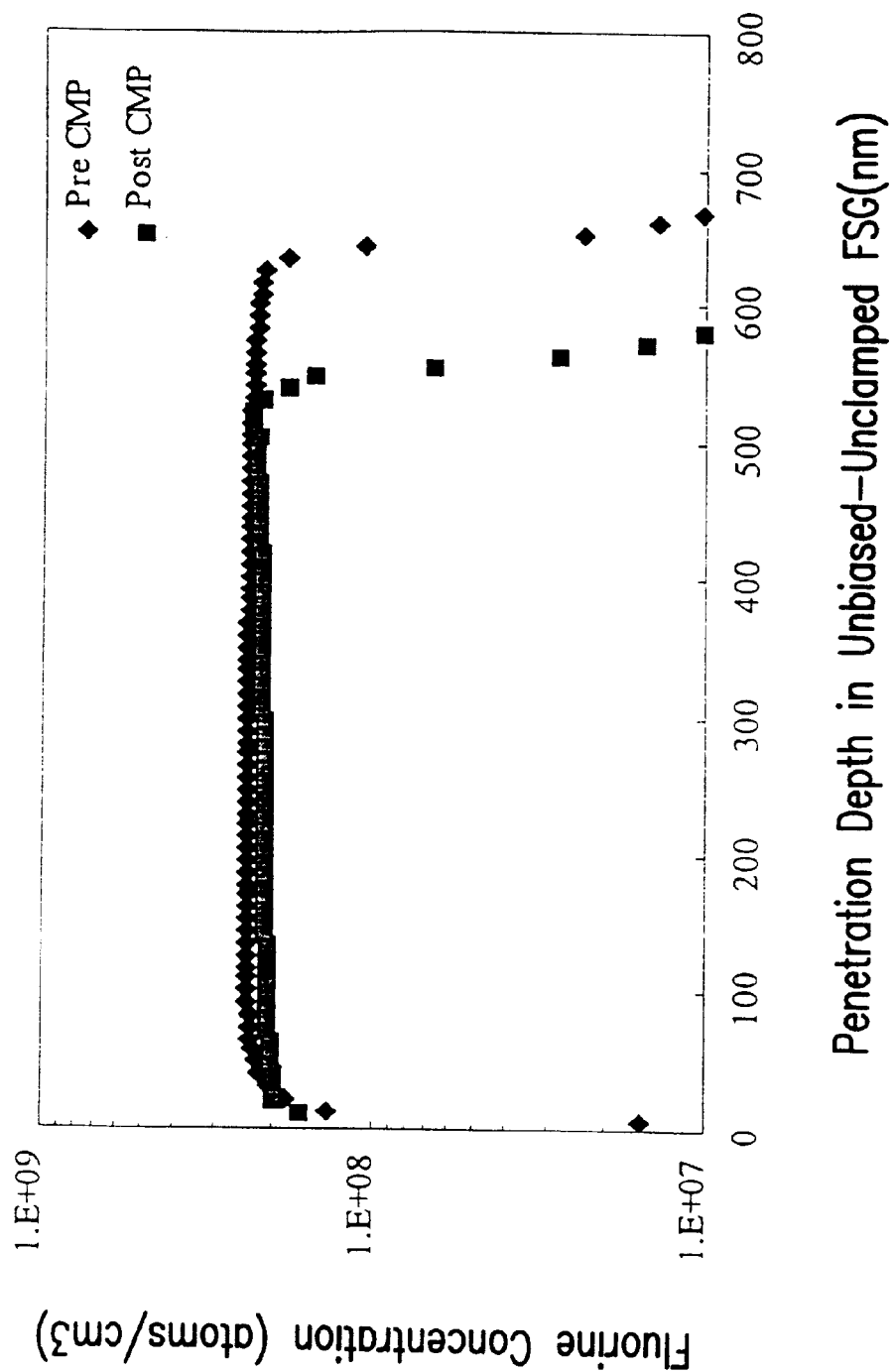
FIG. 3 shows the relationship between the penetration depth (rim) in the unbiased-unclamped FSG layer and fluorine concentration using Secondary Ion Mass Spectroscopy.

FIG. 2 shows the relationship between the penetration depth (nm) in the unbiased-unclamped FSG layer and hydrogen concentration using Secondary Ion Mass Spectroscopy (SIMS). FIG. 3 shows the relationship between the penetration depth (nm) in the unbiased-clamped FSG layer and fluorine concentration using secondary ion mass spectroscopy.

Referring to FIG. 2 and Table 1, there is no obvious change in the hydrogen concentrations before and after CMP. This indicates that the unbiased-unclamped FSG layer efficiently prevents the HF from being produced, and further prevents metal corrosion, oxide degradation, peeling at the metal/intermetal dielectric layer interface, and an increased dielectric constant.

TABLE 1

| | Fluorine concentration in percentage (%)* | Hydrogen concentration in percentage (%)** |
| --- | --- | --- |
| Before the CMP | 13.17 | 0.140 |
| After the CMP | 13.13 | 0.126 |

*obtained by Fourier Transfer Infra-Red
**obtained by Secondary Ion Mass Spectroscopy Referring to FIG. 3 and Table 1, there is no obvious variation in the fluorine concentrations before and after CMP. This indicates that the unbiased-unclamped FSG layer efficiently prevents the HF from being produced, and further prevents metal corrosion, oxide degradation, peeling at the metal/intermetal dielectric layer interface, and an increased dielectric constant.

In addition, the invention not only applies to the multi-level interconnect process, but also applies to for example, the metal plug process, the dual damascene process, the dielectric layer depositing process between the conductive lines, etc.

Other embodiments of the invention will appear to those skilled in the art from consideration of the specification and practice of the invention disclosed herein. It is intended that the specification and examples be considered as exemplary only. With a true scope and spirit of the invention being indicated by the following claims.

What is claimed is:

1. A method for forming an intermetal dielectric layer, comprising:

providing a substrate;

forming a plurality of metal conductive lines on the substrate, wherein a tied conductive line region and a loose conductive line region consist of the plurality of metal conductive lines;

forming a biased-clamped intermetal dielectric layer on the substrate;

forming an unbiased-unclamped protection layer on the biased-clamped intermetal dielectric layer wherein the unbiased-unclamped protection layer is thinner than the biased-clamped intermetal dielectric layer;

forming a cap layer on the unbiased-unclamped protection layer; and exposing the protection layer.

2. The method for forming the intermetal dielectric layer according to claim 1, wherein the unbiased-unclamped protection layer is a unbiased-unclamped fluorinated silicon glass layer.

3. The method for forming the intermetal dielectric layer according to claim 1, wherein the unbiased-unclamped protection layer is formed by using a high density plasma chemical vapor deposition.

4. A method for forming an intermetal dielectric layer over a semiconductor substrate, the substrate comprising at least a plurality conductive lines, the method comprising:

transferring the substrate into a chamber of a chemical vapor deposition (CVD) system;

forming a composite low k dielectric layer over the substrate, comprising:
biasing and clamping the CVD system;
initiating deposition process to deposit a first low k dielectric layer until said conductive line is covered by the first low k dielectric layer; and
unbiasing and unclamping the CVD system during the deposition process to deposit a thin layer of a second low k dielectric layer over the entire said first low k dielectric layer.

* * * * *